(12) United States Patent
Ock et al.

(10) Patent No.: US 11,616,505 B1
(45) Date of Patent: Mar. 28, 2023

(54) TEMPERATURE-COMPENSATED LOW-PASS FILTER

(71) Applicant: QUALCOMM Incorporated, San Diego, CA (US)

(72) Inventors: Sungmin Ock, San Diego, CA (US); Chenling Huang, Mountain View, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 17/674,666

(22) Filed: Feb. 17, 2022

(51) Int. Cl.
| | | |
|---|---|---|
| *H03K 17/14* | (2006.01) | |
| *H03K 17/16* | (2006.01) | |
| *H03H 11/04* | (2006.01) | |
| *H04M 1/02* | (2006.01) | |
| *H03K 3/03* | (2006.01) | |
| *H03F 3/45* | (2006.01) | |

(52) U.S. Cl.
CPC ......... *H03K 17/16* (2013.01); *H03H 11/0422* (2013.01); *H04M 1/026* (2013.01); *H03F 3/45475* (2013.01); *H03K 3/0315* (2013.01)

(58) Field of Classification Search
CPC .. H03K 17/16; H03K 3/0315; H03H 11/0422; H04M 1/026; H03F 3/45475
USPC .......................................................... 327/558
See application file for complete search history.

(56) References Cited

U.S. PATENT DOCUMENTS

| | | | | |
|---|---|---|---|---|
| 5,999,043 A | * | 12/1999 | Zhang ...................... | H03H 1/02 327/558 |
| 6,346,851 B1 | * | 2/2002 | Zhang ...................... | H03H 7/06 327/558 |
| 6,861,827 B1 | * | 3/2005 | Yang ........................ | G05F 1/575 323/280 |
| 7,002,401 B2 | * | 2/2006 | Khalid .................... | H03F 3/505 327/543 |
| 7,026,802 B2 | * | 4/2006 | Gradinariu ............. | G05F 1/575 323/316 |
| 7,262,586 B1 | * | 8/2007 | Gradinariu ................ | G05F 1/56 323/280 |
| 7,319,314 B1 | * | 1/2008 | Maheshwari ............. | G05F 1/46 327/543 |
| 7,397,226 B1 | * | 7/2008 | Mannama ............... | G05F 1/575 327/558 |
| 7,446,515 B2 | * | 11/2008 | Wang ...................... | G05F 1/575 323/280 |
| 7,449,908 B2 | * | 11/2008 | Burns .................... | H04N 7/102 348/E7.052 |
| 7,724,839 B2 | * | 5/2010 | Chen ..................... | H03F 1/0205 375/296 |
| 7,906,952 B2 | * | 3/2011 | Kuo .......................... | G05F 1/56 323/284 |

(Continued)

*Primary Examiner* — Ryan Jager
(74) *Attorney, Agent, or Firm* — Haynes and Boone, LLP

(57) ABSTRACT

A temperature-compensated low-pass filter includes a differential amplifier that controls a first transistor to pass a subthreshold current through the transistor to charge a capacitor with low-pass-filtered output voltage. A second transistor has a first terminal coupled to an input terminal of the low-pass filter and has a second terminal coupled to a current source conducting a bias current. The differential amplifier also controls the second transistor to conduct the bias current responsive to a difference between a complementary-to-absolute-temperature reference voltage and a voltage of the second terminal of the second transistor.

18 Claims, 6 Drawing Sheets

(56) References Cited

U.S. PATENT DOCUMENTS

| | | | | |
|---|---|---|---|---|
| 8,080,984 B1* | 12/2011 | Geynet | .................. | G05F 1/56 |
| | | | | 323/280 |
| 8,148,962 B2* | 4/2012 | Elran | .................. | G05F 1/575 |
| | | | | 323/281 |
| 8,354,875 B2* | 1/2013 | Zhang | .................. | G01K 7/01 |
| | | | | 327/512 |
| 8,531,237 B2* | 9/2013 | Aisu | .................. | G05F 1/575 |
| | | | | 327/558 |
| 8,598,854 B2* | 12/2013 | Soenen | ................ | G05F 1/575 |
| | | | | 363/59 |
| 8,674,672 B1* | 3/2014 | Johal | .................. | G05F 1/575 |
| | | | | 323/280 |
| 8,773,105 B1* | 7/2014 | Kang | .................. | H02H 9/04 |
| | | | | 361/18 |
| 8,912,843 B2 | 12/2014 | Bhattacharyya et al. | | |
| 8,922,188 B2* | 12/2014 | Sakaguchi | ............. | G05F 1/575 |
| | | | | 323/286 |
| 9,059,698 B2* | 6/2015 | Doo | .................. | G05F 1/575 |
| 9,214,852 B2* | 12/2015 | Dong | ................ | H02M 3/157 |
| 9,479,141 B2* | 10/2016 | Köllmann | .......... | H03H 11/1217 |
| 9,829,904 B2* | 11/2017 | Sakaguchi | ............... | G05F 3/02 |
| 9,874,887 B2* | 1/2018 | Yan | ................ | G05F 1/565 |
| 10,461,734 B2* | 10/2019 | Tang | .................. | H03K 17/223 |
| 2004/0104740 A1* | 6/2004 | Burns | .................. | H04N 7/102 |
| | | | | 348/E7.052 |
| 2007/0249305 A1* | 10/2007 | Hsu | .................. | H04W 52/0287 |
| | | | | 455/127.5 |
| 2016/0190331 A1* | 6/2016 | Miyake | .............. | H01L 27/1255 |
| | | | | 257/40 |
| 2016/0211830 A1* | 7/2016 | Itakura | .................. | G01T 1/208 |

* cited by examiner

TEMPERATURE-COMPENSATED LOW-PASS FILTER

TECHNICAL FIELD

This application relates to a low-pass filter, and more particularly to a temperature-compensated low-pass filter.

BACKGROUND

There are a variety of applications in which a low-pass filter should provide a relatively low cutoff frequency yet be amenable for on-die manufacture. For example, a low-dropout regulator (LDO) may be used to provide the supply voltage to a ring oscillator functioning as a voltage-controlled oscillator (VCO). Depending upon the value of a reference voltage processed by the LDO, the VCO frequency is tuned accordingly. But the generation of the reference voltage may be subject to substantial flicker noise. A low-pass filter is thus used to filter out the flicker noise from the reference voltage prior to the receipt of the reference voltage at the LDO. Without the low-pass filtering, the flicker noise could then ruin the fidelity of the VCO.

To sufficiently suppress the flicker noise, the 3 dB frequency of the low-pass filter may need to be less than 10 KHz. Achieving such a relatively low cutoff frequency using passive components that can be integrated onto semiconductor die is difficult. It is thus conventional to instead implement the low-pass filter using active components that are biased with a bias current from a current source. As the temperature rises, the bias current tends to increase nonlinearly, which results in a rise in the cutoff frequency of the low-pass filter.

Accordingly, there is a need in the art for active low-pass filters having improved temperature compensation.

SUMMARY

In accordance with an aspect of the disclosure, a temperature-compensated low-pass filter is provided that includes: a first transistor; a first current source; a second transistor having a first terminal coupled to a first terminal of the first transistor and having a second terminal coupled to the first current source; and a differential amplifier having an output terminal coupled to a gate of the first transistor and a gate of the second transistor, the differential amplifier having a first input terminal coupled to a node for a reference voltage and a second input terminal coupled to the second terminal of the second transistor.

In accordance with another aspect of the disclosure, a method is provided that includes: generating a complementary-to-absolute-temperature reference voltage; biasing a gate of a first transistor with a gate voltage to cause the first transistor to conduct a bias current while a first terminal of the first transistor is charged to an input voltage and a second terminal of the first transistor is charged to the complementary-to-absolute temperature reference voltage; and biasing a gate of a second transistor with the gate voltage to cause the second transistor to charge a capacitor with a subthreshold current to produce a low-pass-filtered version of the input voltage at a terminal of the capacitor.

In accordance with yet another aspect of the disclosure, a temperature-compensated low-pass filter is provided that includes: a first transistor coupled between an input terminal and an output terminal; a second transistor having a first terminal coupled to the input terminal; a diode-connected transistor; a current source configured to drive a current into the diode-connected transistor to develop a voltage across the diode-connected transistor; and a differential amplifier configured to charge a gate of the first transistor with a gate voltage and to charge a gate of the second transistor with the gate voltage responsive to a difference between the voltage across the diode-connected transistor and a voltage of a second terminal of the second transistor.

These and additional advantageous features may be better appreciated through the following detailed description.

BRIEF DESCRIPTION OF THE DRAWINGS

Implementations of the present disclosure and their advantages are best understood by referring to the detailed description that follows. It should be appreciated that like reference numerals are used to identify like elements illustrated in one or more of the figures.

DETAILED DESCRIPTION

To provide a temperature-compensated low-pass filter, a transistor is disclosed that has a first terminal that is also an input terminal of the temperature-compensated low-pass filter. Similarly, the transistor has a second terminal that is also an output terminal of the temperature-compensated low-pass filter. A capacitor for the temperature-compensated low-pass filter couples between the output terminal and ground. A subthreshold bias circuit charges a gate of the transistor with a gate voltage to bias the first transistor to function in the subthreshold region of operation and conduct a subthreshold current to the capacitor. In the subthreshold region, the transistor functions as a resistor. The RC time constant $\tau$ of the low-pass filter is thus a product of a resistance R of the transistor and a capacitance C of the capacitor.

Figure 1A:
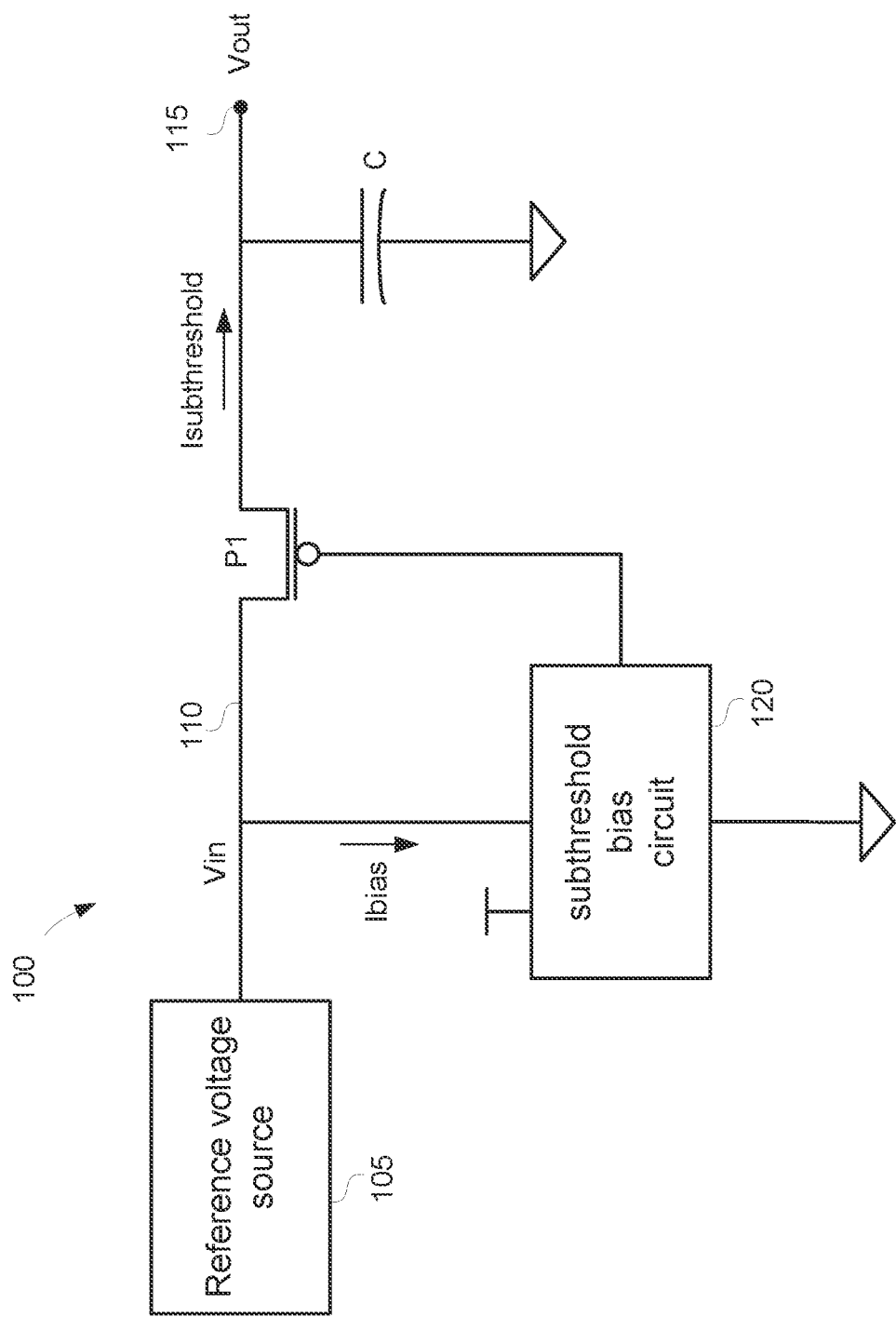
FIG. 1A illustrates a temperature-compensated low-pass filter in accordance with an aspect of the disclosure.

A reference voltage circuit such as a voltage divider formed by a resistive digital-to-analog converter generates an input voltage at the input terminal. The current driving capability of the reference voltage circuit is typically limited such that a bias current drawn by the subthreshold bias circuit from the input terminal should be relatively small (e.g., less than 10 nA). An example temperature-compensated low-pass filter 100 with a subthreshold bias circuit 120 is shown in FIG. 1A. A reference voltage source 105 generates an input voltage (which may also be denoted as a reference voltage) at an input terminal 110 of temperature-compensated low-pass filter 100. A p-type metal-oxide-semiconductor (PMOS) transistor P1 operates in the subthreshold region of operation to provide the resistance R in the RC time constant τ of the temperature-compensated low-pass filter 100. In alternative implementations, transistor P1 may be an n-type metal-oxide-semiconductor (NMOS) transistor. A capacitor C provides the capacitance in the RC time constant τ. The capacitor C has a first terminal coupled to an output terminal 115 of the temperature-compensated low-pass filter 100 and a second terminal coupled to ground. Input terminal 110 may also be denoted herein as a first terminal of transistor P1. Similarly, output terminal 115 may also be denoted herein as a second terminal of transistor P1.

Subthreshold bias circuit 120 controls a gate voltage of transistor P1 so that transistor P1 conducts a subthreshold current. Subthreshold bias circuit 120 also couples to input terminal 110 to receive a bias current Ibias. Given the constraint on the current draw of the subthreshold bias circuit 120, subthreshold bias circuit 120 may include (as further described herein) a first current source mirrored through a current mirror having a relatively large current mirror ratio (e.g., greater than 1,000) to produce the bias current Ibias.

Figure 1B:
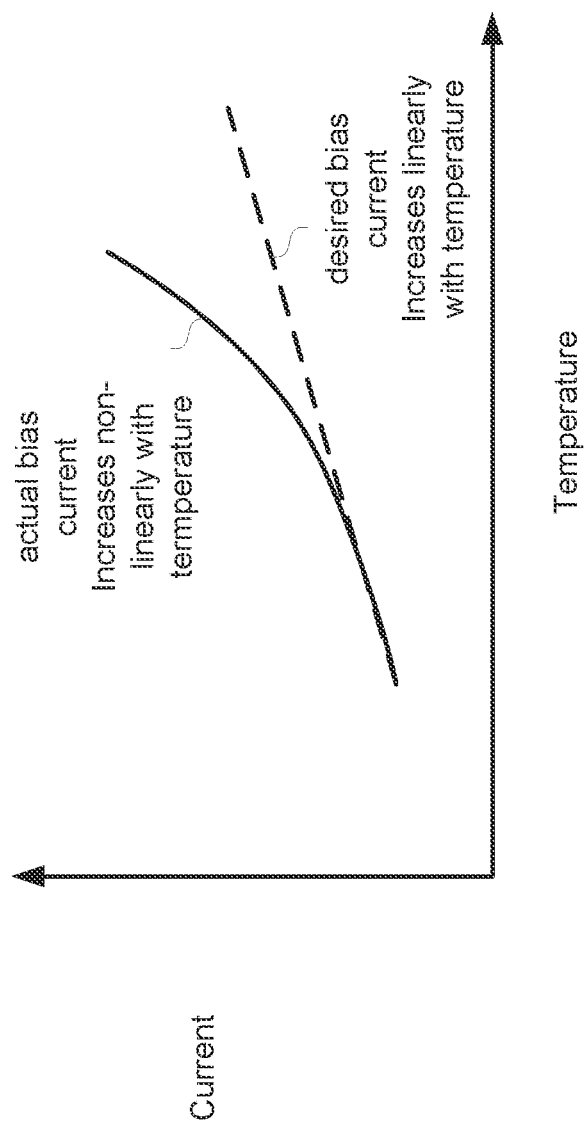
FIG. 1B is a plot of the bias current in the subthreshold bias circuit in the low-pass filter of FIG. 1A as a function of temperature and also a plot the desired bias current behavior with respect to temperature.

Given this large current mirror ratio and increased leakage at higher temperatures, the bias current Ibias may tend to increase non-linearly as the temperature increases. An example non-linear increase in the bias current Ibias is shown in FIG. 1B. The desired behavior for the bias current Ibias would be to increase linearly with temperature but due to non-idealities in subthreshold bias circuit 120 the bias current Ibias instead increases non-linearly with temperature. This non-linear increase in the bias current Ibias limits the cutoff frequency of low-pass filter 100. To better appreciate this limitation on the cutoff frequency, note that the cutoff frequency is inversely proportional to the RC time constant τ. The traditional non-linear increase in the bias current Ibias causes the resistance of transistor P1 to drop, which in turn causes the cutoff frequency to rise due to this inverse proportionality. In sharp contrast, subthreshold bias circuit 120 is configured to address the non-linear increase in the bias current Ibias due to temperature increases by a corresponding adjustment in the gate voltage of transistor P1. In this fashion, the cutoff frequency of low-pass filter 100 is maintained suitably low despite thermal variations.

Figure 2:
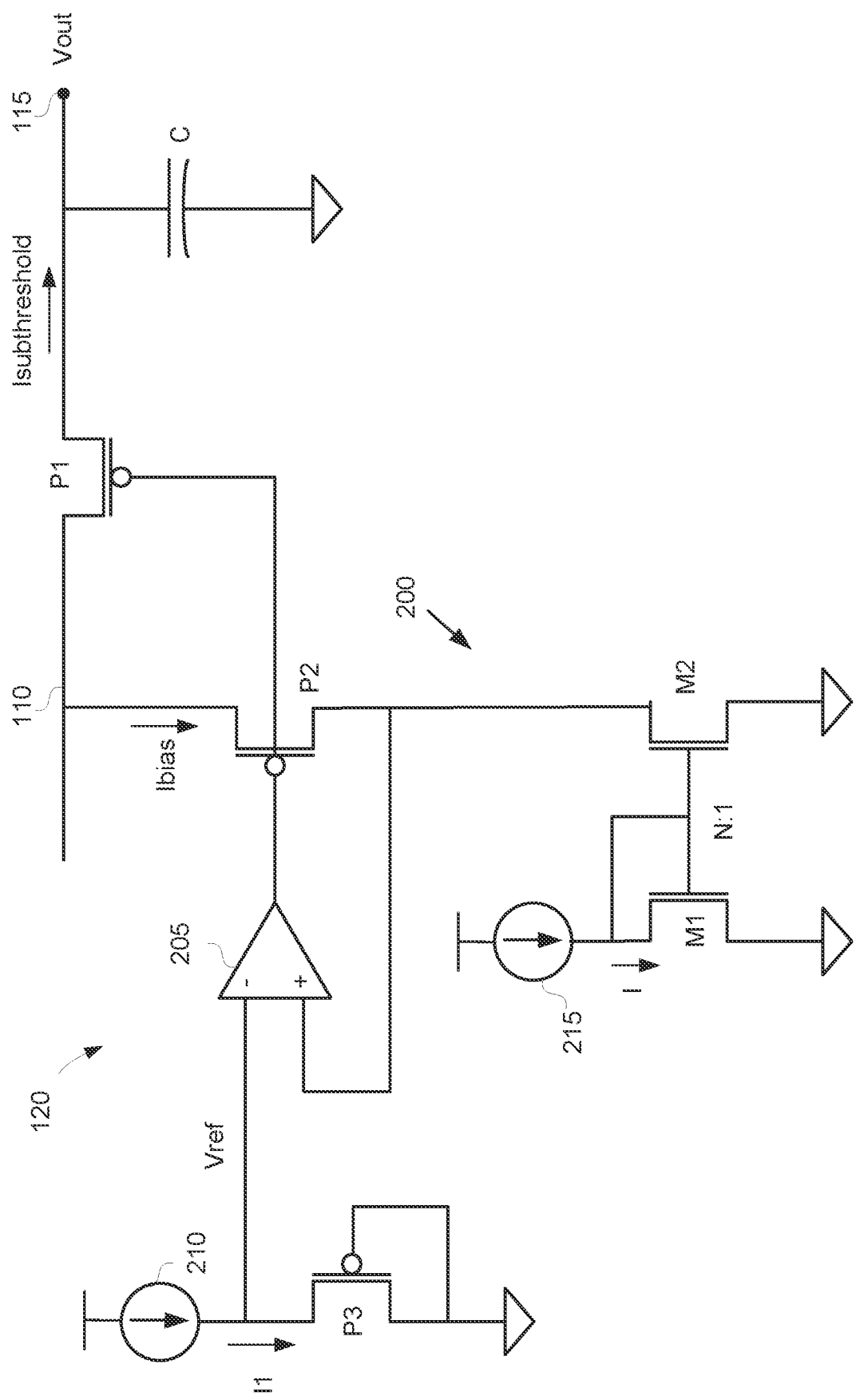
FIG. 2 illustrates additional circuit details for the subthreshold bias circuit in the low-pass filter of FIG. 1A in accordance with an aspect of the disclosure.

An example implementation of subthreshold bias circuit 120 is shown in more detail in FIG. 2. A current source 200 generates bias current Ibias at a drain of a PMOS transistor P2. Current source 200 is also denoted herein as a first current source. The source of transistor P2 couples to input terminal 110 of low-pass filter 100. The drain of transistor P2 may also be denoted herein as a first terminal of transistor P2. Similarly, the source of transistor P2 may also be denoted as a second terminal of transistor P2. In alternative implementations, transistor P2 may be an NMOS transistor. Current source 200 includes a current mirror formed by an n-type metal-oxide-semiconductor (NMOS) current mirror transistor M2 having its drain coupled to the drain of transistor P1 and a source coupled to ground. A diode-connected NMOS transistor M1 has its gate and drain coupled to the gate of current mirror transistor M2 and a source connected to ground. A current source 215 drives a current source current I into the drain of diode-connected transistor M1. Due to the current mirror configuration of diode-connected transistor M1 and current mirror transistor M2, current I is mirrored to form the bias current Ibias. To ensure that the bias current Ibias is relatively small, there is a relatively large current mirror ratio (N:1, where N is, for example, 1000) caused by a size difference between diode-connected transistor M1 and current mirror transistor M2. In this fashion, the bias current Ibias is 1/Nth times smaller than the current I. Current I may thus be in the pA range whereas the bias current Ibias may be in the nano-amp range (e.g., less than 10 nA). In this fashion, the relatively low drive current capability of reference voltage source 105 (FIG. 1A) may be accommodated by a corresponding relatively small bias current Ibias. Transistor P1 and transistor P2 are referred to herein as a first transistor and a second transistor, respectively. Alternatively, transistor P2 and transistor P1 are referred to herein as a first transistor and a second transistor, respectively.

Subthreshold bias circuit 120 also includes a differential amplifier 205 having an output terminal that drives a gate voltage of transistors P1 and P2 responsive to a difference between the drain voltage of transistor P2 and a reference voltage Vref. To generate the reference voltage Vref, subthreshold bias circuit 120 includes a current source 210 that drives a current I1 into a source of a diode-connected PMOS transistor P3 having its gate and drain coupled to ground. Current source 210 is also denoted herein as a second current source. It can be shown that the drain-to-source voltage (the reference voltage Vref) of diode-connected transistor P3 is a complementary-to-absolute-temperature voltage. The reference voltage Vref will thus decrease as the temperature rises. The feedback through differential amplifier 205 functions to keep the drain voltage of transistor P2 substantially equal to the reference voltage Vref. As the reference voltage Vref decreases with increasing temperatures, the absolute value of the drain-to-source voltage across transistor P2 increases.

Like transistor P1, transistor P2 is biased to operate in the linear (subthreshold) region. For transistor P2 to conduct the bias current Ibias at a given level of drain-to-source voltage requires a corresponding gate-to-source voltage of transistor P2. As the absolute value of the drain-to-source voltage increases for a given amount of bias current Ibias, the gate-to-source voltage of transistor P2 must increase for transistor P2 to continue to conduct the same amount of bias current. The feedback through differential amplifier 205 will thus function to cause the gate voltage of transistors P1 and P2 to rise as the absolute value of the drain-to-source voltage increases for transistor P2. This increased gate voltage on transistor P1 advantageously maintains the resistance of transistor P1 even though the bias current Ibias increases non-linearly with temperature. In this fashion, the temperature-compensated low-pass filter 100 provides a suitably low cutoff frequency even at higher temperatures.

Figure 3:
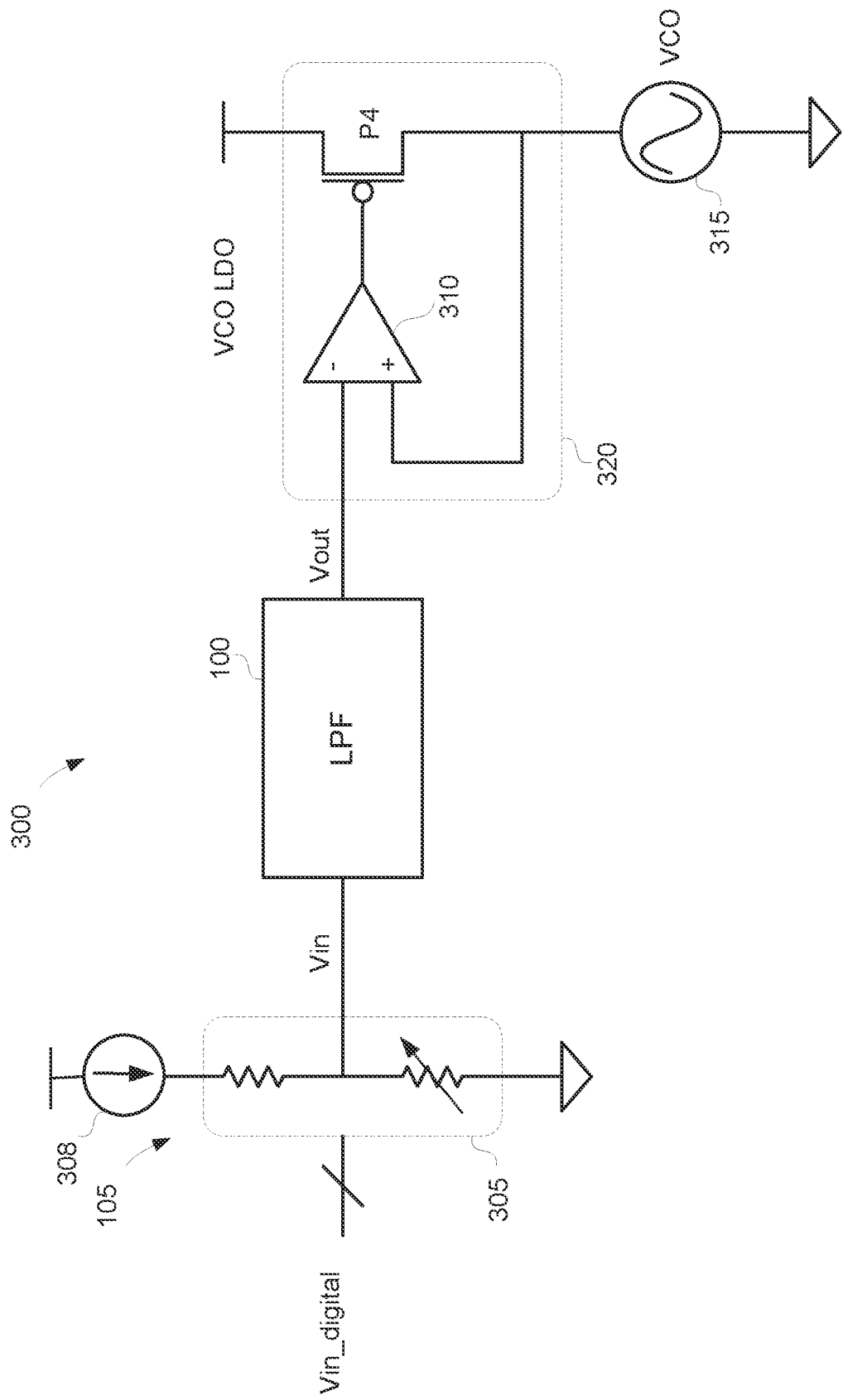
FIG. 3 illustrates a voltage-controlled oscillator system incorporating a temperature-compensated low-pass filter in accordance with an aspect of the disclosure.

An example system 300 incorporating the temperature-compensated low-pass filter 100 is shown in FIG. 3. Reference voltage source 105 in system 300 is formed by a resistive digital-to-analog converter (DAC) 305 that adjusts a variable resistance responsive to a digital input code Vin_digital. Based upon the variable resistance, the resistive DAC 305 functions as a voltage divider that is biased by a current from a current source 308 to generate the input voltage Vin for the temperature-compensated low-pass filter 100. A differential amplifier 310 in an LDO 320 compares the output voltage from low-pass filter 100 to a drain voltage of a PMOS transistor P4 to generate a gate voltage of transistor P4. A source of transistor P4 couples to a power supply voltage node. The feedback in differential amplifier 310 will tend to keep the drain voltage of transistor P4 substantially equal to the output voltage Vout. The drain voltage of transistor P4 is also denoted herein as a low-dropout output voltage.

The drain voltage of transistor P4 forms a supply voltage to a ring oscillator 315 that functions as a voltage-controlled oscillator (VCO). The oscillation frequency of VCO 315 is thus controlled by the output voltage Vout, which in turn is a low-pass-filtered version of the input voltage Vin, which in turn is set by the digital input code Vin_digital. By tuning the digital input code Vin_digital, the VCO frequency is tuned accordingly. Any flicker noise in the input voltage Vin is substantially eliminated by low-pass filter 100 in the output voltage Vout. Without the advantageous temperature-compensated features of low-pass filter 100, the cutoff frequency of low-pass filter 100 could have undesirably risen at increased temperatures, which would lower the fidelity of the VCO performance But the temperature compensation in low-pass filter 100 maintains the cutoff frequency suitably low despite temperatures increases.

Figure 4:
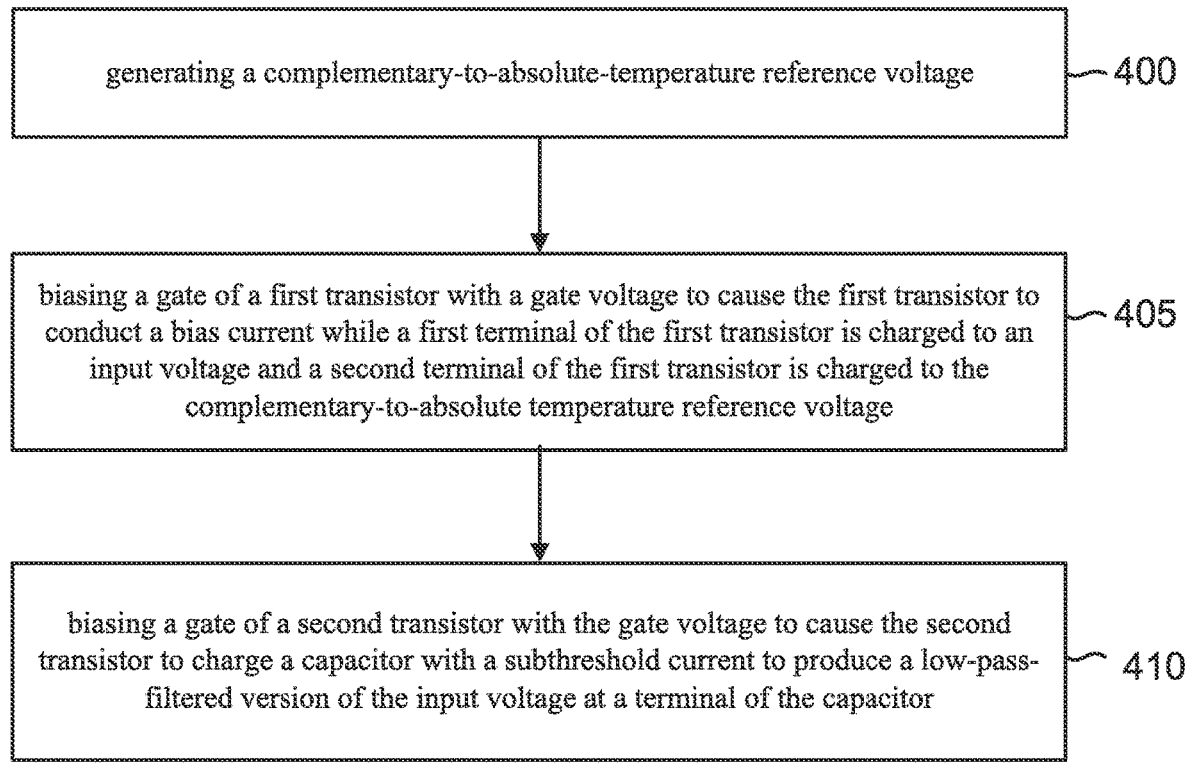
FIG. 4 is a flowchart of an example method of operation for a temperature-compensated low-pass filter in accordance with an aspect of the disclosure.

An example method of operation with a temperature-compensated low-pass filter in accordance with an aspect of the disclosure will now be discussed with regard to the flowchart of FIG. 4. The method includes an act 400 of generating a complementary-to-absolute-temperature reference voltage. The generation of the reference voltage across diode-connected transistor P3 is an example of act 400. The method also includes an act 405 of biasing a gate of a first transistor with a gate voltage to cause the first transistor to conduct a bias current while a first terminal of the first transistor is charged to an input voltage and a second terminal of the first transistor is charged to the complementary-to-absolute temperature reference voltage. The biasing of the gate voltage of transistor P2 to conduct the bias current Ibias while its source is charged to the input voltage and its drain is charged to the reference voltage Vref is an example of act 405. Finally, the method includes an act 410 of biasing a gate of a second transistor with the gate voltage to cause the second transistor to charge a capacitor with a subthreshold current to produce a low-pass-filtered version of the input voltage at a terminal of the capacitor. The biasing of the gate voltage of transistor P1 to produce the output voltage across the capacitor C in low-pass filter 100 is an example of act 410.

Figure 5:
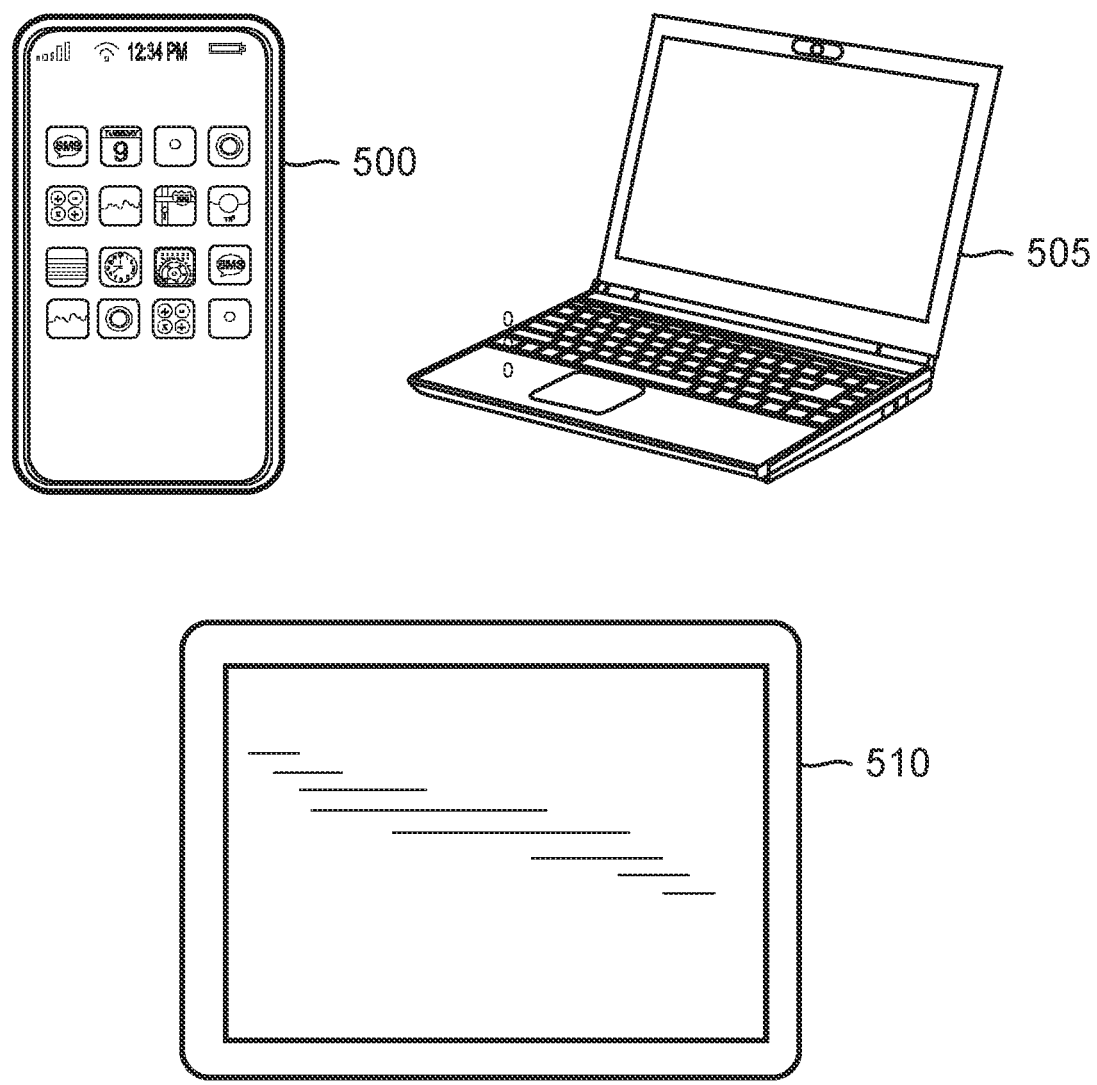
FIG. 5 illustrates some example electronic systems each incorporating a temperature-compensated low-pass filter in accordance with an aspect of the disclosure.

A temperature-compensated low-pass filter as disclosed herein may be incorporated into a wide variety of electronic systems. For example, as shown in FIG. 5, a cellular telephone 500, a laptop computer 505, and a tablet PC 510 may all include a temperature-compensated low-pass filter in accordance with aspects of the disclosure. Other exemplary electronic systems such as a music player, a video player, a communication device, and a personal computer may also be configured with temperature-compensated low-pass filters constructed in accordance with the disclosure.

Some aspects of the disclosure will now be summarized in the following series of example clauses:

Clause 1. A temperature-compensated low-pass filter, comprising:
 a first transistor;
 a first current source;
 a second transistor having a first terminal coupled to a first terminal of the first transistor and having a second terminal coupled to the first current source; and
 a differential amplifier having an output terminal coupled to a gate of the first transistor and a gate of the second transistor, the differential amplifier having a first input terminal coupled to a node for a reference voltage and a second input terminal coupled to the second terminal of the second transistor.

Clause 2. The temperature-compensated low-pass filter of clause 1, further comprising:
 a voltage reference source configured to generate the reference voltage to be a complementary-to-absolute-temperature voltage.

Clause 3. The temperature-compensated low-pass filter of clause 2, wherein the voltage reference source comprises:
 a second current source; and
 a diode-connected transistor having a first terminal coupled to the second current source and a second terminal coupled to ground.

Clause 4. The temperature-compensated low-pass filter of clause 3, wherein the diode-connected transistor is a p-type metal-oxide-semiconductor (PMOS) transistor, and wherein the first terminal of the diode-connected transistor is a source terminal and wherein the second terminal of the diode-connected transistor is a drain terminal.

Clause 5. The temperature-compensated low-pass filter of clause 3, wherein the first current source comprises a current mirror including a diode-connected transistor having a gate connected to a gate of a current mirror transistor.

Clause 6. The temperature-compensated low-pass filter of clause 5, wherein a size of the diode-connected transistor is larger than a size of the current mirror transistor.

Clause 7. The temperature-compensated low-pass filter of any of clauses 1-6, further comprising:
 a capacitor coupled between a second terminal of the first transistor and ground.

Clause 8. The temperature-compensated low-pass filter of clause 7, further comprising:
 a resistive digital-to-analog converter configured to charge the first terminal of the first transistor with an input voltage responsive to a conversion of a digital input word;
 a low-drop-out regulator configured to regulate a low-dropout output voltage responsive to a difference between the low-dropout output voltage and a voltage of the second terminal of the first transistor; and
 a voltage-controlled oscillator configured to oscillate responsive to the low-dropout output voltage.

Clause 9. The temperature-compensated low-pass filter of clause 8, wherein the voltage-controlled oscillator is a ring oscillator, and wherein the low-dropout output voltage is a power supply voltage of the ring oscillator.

Clause 10. The temperature-compensated low-pass filter of any of clauses 1-8, wherein the temperature-compensated low-pass filter is integrated into a cellular telephone.

Clause 11. A method, comprising:
 generating a complementary-to-absolute-temperature reference voltage;
 biasing a gate of a first transistor with a gate voltage to cause the first transistor to conduct a bias current while a first terminal of the first transistor is charged to an input voltage and a second terminal of the first transistor is charged to the complementary-to-absolute temperature reference voltage; and
 biasing a gate of a second transistor with the gate voltage to cause the second transistor to charge a capacitor with a subthreshold current to produce a low-pass-filtered version of the input voltage at a terminal of the capacitor.

Clause 12. The method of clause 11, wherein generating the complementary-to-absolute-temperature reference voltage comprises driving a current into a terminal of a diode-connected transistor to generate the complementary-to-absolute-temperature reference voltage at the terminal of the diode-connected transistor.

Clause 13. The method of any of clauses 11-12, further comprising:
 mirroring a current source current through a current mirror transistor coupled to the first transistor to generate the bias current in the current mirror transistor.

Clause 14. The method of any of clauses 11-13, wherein the current source current is larger than the bias current.

Clause 15. The method of any of clauses 11-14, further comprising:
generating the input voltage in a digital-to-analog converter.

Clause 16. The method of any of clauses 11-15, further comprising:
generating a low-dropout output voltage in a low-drop-out regulator responsive to a difference between the low-dropout output voltage and the low-pass-filtered version of the input voltage; and oscillating an output signal of a voltage-controlled oscillator responsive to the low-dropout output voltage.

Clause 17. A temperature-compensated low-pass filter, comprising:
a first transistor coupled between an input terminal and an output terminal;
a second transistor having a first terminal coupled to the input terminal;
a diode-connected transistor;
a current source configured to drive a current into the diode-connected transistor to develop a voltage across the diode-connected transistor; and
a differential amplifier configured to charge a gate of the first transistor with a gate voltage and to charge a gate of the second transistor with the gate voltage responsive to a difference between the voltage across the diode-connected transistor and a voltage of a second terminal of the second transistor.

Clause 18. The temperature-compensated low-pass filter of clause 17, further comprising:
a current mirror coupled to the second terminal of the second transistor.

Clause 19. The temperature-compensated low-pass filter of any of clauses 17-18, further comprising:
a capacitor coupled between the output terminal and ground.

Clause 20. The temperature-compensated low-pass filter of any of clauses 17-19, wherein the first transistor and the second transistor are both p-type metal-oxide-semiconductor (PMOS) transistors.

As those of some skill in this art will by now appreciate and depending on the particular application at hand, many modifications, substitutions and variations can be made in and to the materials, apparatus, configurations and methods of use of the devices of the present disclosure without departing from the scope thereof. In light of this, the scope of the present disclosure should not be limited to that of the particular implementations illustrated and described herein, as they are merely by way of some examples thereof, but rather, should be fully commensurate with that of the claims appended hereafter and their functional equivalents.

What is claimed is:

1. A temperature-compensated low-pass filter, comprising:
a first transistor;
a first current source;
a second transistor having a first terminal coupled to a first terminal of the first transistor and having a second terminal coupled to the first current source;
a differential amplifier having an output terminal coupled to a gate of the first transistor and a gate of the second transistor, the differential amplifier having a first input terminal coupled to a node for a reference voltage and a second input terminal coupled to the second terminal of the second transistor; and
a voltage reference source configured to generate the reference voltage to be a complementary-to-absolute-temperature voltage.

2. The temperature-compensated low-pass filter of claim 1, wherein the voltage reference source comprises:
a second current source; and
a diode-connected transistor having a first terminal coupled to the second current source and a second terminal coupled to ground.

3. The temperature-compensated low-pass filter of claim 2, wherein the diode-connected transistor is a p-type metal-oxide-semiconductor (PMOS) transistor, and wherein the first terminal of the diode-connected transistor is a source terminal and wherein the second terminal of the diode-connected transistor is a drain terminal.

4. The temperature-compensated low-pass filter of claim 2, wherein the first current source comprises a current mirror including a diode-connected transistor having a gate connected to a gate of a current mirror transistor.

5. The temperature-compensated low-pass filter of claim 4, wherein a size of the diode-connected transistor is larger than a size of the current mirror transistor.

6. The temperature-compensated low-pass filter of claim 1, further comprising:
a capacitor coupled between a second terminal of the first transistor and ground.

7. The temperature-compensated low-pass filter of claim 6, further comprising:
a resistive digital-to-analog converter configured to charge the first terminal of the first transistor with an input voltage responsive to a conversion of a digital input word;
a low-drop-out regulator configured to regulate a low-dropout output voltage responsive to a difference between the low-dropout output voltage and a voltage of the second terminal of the first transistor; and
a voltage-controlled oscillator configured to oscillate responsive to the low-dropout output voltage.

8. The temperature-compensated low-pass filter of claim 7, wherein the voltage-controlled oscillator is a ring oscillator, and wherein the low-dropout output voltage is a power supply voltage of the ring oscillator.

9. The temperature-compensated low-pass filter of claim 7, wherein the temperature-compensated low-pass filter is integrated into a cellular telephone.

10. A method, comprising:
generating a complementary-to-absolute-temperature reference voltage;
biasing a gate of a first transistor with a gate voltage to cause the first transistor to conduct a bias current while a first terminal of the first transistor is charged to an input voltage and a second terminal of the first transistor is charged to the complementary-to-absolute temperature reference voltage;
biasing a gate of a second transistor with the gate voltage to cause the second transistor to charge a capacitor with a subthreshold current to produce a low-pass-filtered version of the input voltage at a terminal of the capacitor; and
mirroring a current source current through a current mirror transistor coupled to the first transistor to generate the bias current in the current mirror transistor.

11. The method of claim 10, wherein generating the complementary-to-absolute-temperature reference voltage comprises driving a current into a terminal of a diode-connected transistor to generate the complementary-to-absolute-temperature reference voltage at the terminal of the diode-connected transistor.

12. The method of claim 10, wherein the current source current is larger than the bias current.

13. The method of claim 10, further comprising:
generating the input voltage in a digital-to-analog converter.

14. The method of claim 10, further comprising:
generating a low-dropout output voltage in a low-drop-out regulator responsive to a difference between the low-dropout output voltage and the low-pass-filtered version of the input voltage; and
oscillating an output signal of a voltage-controlled oscillator responsive to the low-dropout output voltage.

15. A temperature-compensated low-pass filter, comprising:
a first transistor coupled between an input terminal and an output terminal;
a second transistor having a first terminal coupled to the input terminal;
a diode-connected transistor;
a current source configured to drive a current into the diode-connected transistor to develop a voltage across the diode-connected transistor; and
a differential amplifier configured to charge a gate of the first transistor with a gate voltage and to charge a gate of the second transistor with the gate voltage responsive to a difference between the voltage across the diode-connected transistor and a voltage of a second terminal of the second transistor.

16. The temperature-compensated low-pass filter of claim 15, further comprising:
a current mirror coupled to the second terminal of the second transistor.

17. The temperature-compensated low-pass filter of claim 15, further comprising:
a capacitor coupled between the output terminal and ground.

18. The temperature-compensated low-pass filter of claim 15, wherein the first transistor and the second transistor are both p-type metal-oxide-semiconductor (PMOS) transistors.

* * * * *